United States Patent
Lee

(10) Patent No.: US 7,470,623 B2
(45) Date of Patent: Dec. 30, 2008

(54) METHOD OF FORMING A PLATINUM PATTERN

(75) Inventor: Woo Jin Lee, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 256 days.

(21) Appl. No.: 11/493,126

(22) Filed: Jul. 26, 2006

(65) Prior Publication Data

US 2006/0264052 A1    Nov. 23, 2006

Related U.S. Application Data

(62) Division of application No. 10/460,695, filed on Jun. 12, 2003, now abandoned.

(30) Foreign Application Priority Data

Jun. 19, 2002    (KR)  ................ 2002-34376

(51) Int. Cl.
*H01L 21/302*    (2006.01)
*C09K 13/00*    (2006.01)
(52) U.S. Cl. ............................ 438/692; 252/79.1
(58) Field of Classification Search ................ 438/692; 252/79.1, 79.2, 79.4
See application file for complete search history.

(56) References Cited

U.S. PATENT DOCUMENTS

| | | | |
|---|---|---|---|
| 3,436,286 A | 4/1969 | Lange | 156/17 |
| 3,764,424 A | 10/1973 | Sayko | 156/17 |
| 4,956,313 A | 9/1990 | Cote et al. | 437/203 |
| 5,575,885 A | 11/1996 | Hirabayashi et al. | 156/626.1 |
| 5,938,505 A | 8/1999 | Morrison et al. | 451/36 |
| 5,957,757 A | 9/1999 | Berman | 451/56 |
| 6,143,662 A * | 11/2000 | Rhoades et al. | 438/690 |
| 6,214,728 B1 * | 4/2001 | Chan et al. | 438/678 |
| 6,244,929 B1 | 6/2001 | Russ et al. | 451/5 |
| 6,290,736 B1 | 9/2001 | Evans | 51/307 |
| RE37,786 E | 7/2002 | Hirabayashi et al. | 438/14 |
| 6,555,466 B1 * | 4/2003 | Laursen et al. | 438/626 |
| 6,576,479 B2 * | 6/2003 | Chen et al. | 438/3 |
| 6,576,554 B2 * | 6/2003 | Matsui et al. | 438/693 |

FOREIGN PATENT DOCUMENTS

| | | |
|---|---|---|
| JP | 2001-023940 | 1/2001 |
| KR | 2002-40091 | 5/2002 |

(Continued)

OTHER PUBLICATIONS

Notice of Rejection from Korean Intellectual Property Office dated Jun. 30, 2004, with English translation (4 pages).

(Continued)

*Primary Examiner*—Binh X Tran
(74) *Attorney, Agent, or Firm*—Marshall, Gerstein & Borun LLP

(57) ABSTRACT

A solution for platinum chemical mechanical polishing is disclosed. Further, a method for forming Pt patterns is disclosed which utilizes the disclosed Pt-CMP solution which contains an alkali aqueous solution and an oxidizer which improves the polishing rate and polishing characteristics of Pt which forms a lower electrode of a metal capacitor.

14 Claims, 4 Drawing Sheets

FOREIGN PATENT DOCUMENTS

KR      2002-44062      6/2003

OTHER PUBLICATIONS

"Method for Planarizing Semiconductor Integrated Circuit and Chemical Mechanical Polishing Slurry Therefor", Kazuo et al., Jan. 26, 2001, English translation by computer of JP 2001023940, 11 pages.

Semiconductor Integrated Circuit Flattening . . . Measurement of Exposed Layers, Kazuo et al., Jan. 26, 2001, English Abstract (Derwent) of JP 2001023940, 2 pages.

* cited by examiner

METHOD OF FORMING A PLATINUM PATTERN

BACKGROUND

1. Technical Field

A solution for platinum (abbreviated as "Pt") chemical mechanical polishing (abbreviated as "CMP") containing an alkali aqueous solution and an oxidizer is disclosed. More specifically, a method for forming Pt patterns including using the above Pt-CMP solution is disclosed which can improve a polishing rate and polishing characteristics of Pt used as a lower electrode of a metal capacitor.

2. Description of the Related Art

Platinum is a noble metal which is chemically and mechanically stable, and is an essential material used in fabricating high performance semiconductor devices. In addition, platinum (Pt) has been recently used as a lower electrode in DRAM devices. The lower electrode is created while forming metal layer/insulating film/metal layer-type capacitors through an electro-deposition process.

However, when the Pt layer is electro-deposited, the current is non-uniform due to the geometry and density of the oxide layer that is used for isolation. As a result, the Pt layer is non-uniformly formed and short-circuit is caused.

In order to solve the above-described problem, after the Pt layer is electro-deposited, a CMP process can be performed on the upper portion of the layer to planarize the Pt layer. However, because the Pt layer has relatively low chemical reactivity, appropriate CMP slurry cannot be provided to polish the Pt during CMP process. Thus, the common slurries intended for other metals such as tungsten or aluminum are employed when polishing platinum.

The slurries intended for other metals also include chemicals for planarizing of the various metal layers on a silicon substrate. In general, the slurry for a metal CMP process with a strong acidity of pH 2~4 contains an abrasive such as alumina ($Al_2O_3$) or manganese oxide ($MnO_2$) and an oxidizer such as hydrogen peroxide ($H_2O_2$) or ferric nitrate ($Fe(NO_3)_2$) as a first additive, using distilled water or ultra pure water. Further, a small amount of surfactant or dispersing agent may be added to improve CMP slurry properties.

Since the polishing speed of Pt layers is very slow, the CMP process is performed for a long period of time under high polishing pressure in order to adequately planarize the Pt.

As a result, the Pt layers may be separated from the interlayer insulating film because the Pt layer has poor adhesion to the interlayer insulating film. In addition, dishing and erosion effects are generated on the Pt layer adjacent to the interlayer insulating film.

Moreover, when the Pt layer is polished for a long time under high polishing pressure, the abrasive included in the slurry can severely scratch the interlayer insulating film, and impurities such as the slurry grounds can remain on the Pt layer. Therefore, the properties of the resultant device are compromised.

SUMMARY OF THE DISCLOSURE

Solutions for platinum CMP are disclosed which can improve the polishing speed of platinum under a low polishing pressure and reduce dishing of the platinum layer and scratches on the interlayer insulating film.

Methods for forming a platinum pattern including CMP process using the above Pt-CMP solution are also disclosed.

DETAILED DESCRIPTION OF THE PRESENTLY PREFERRED EMBODIMENTS

Figure 1:
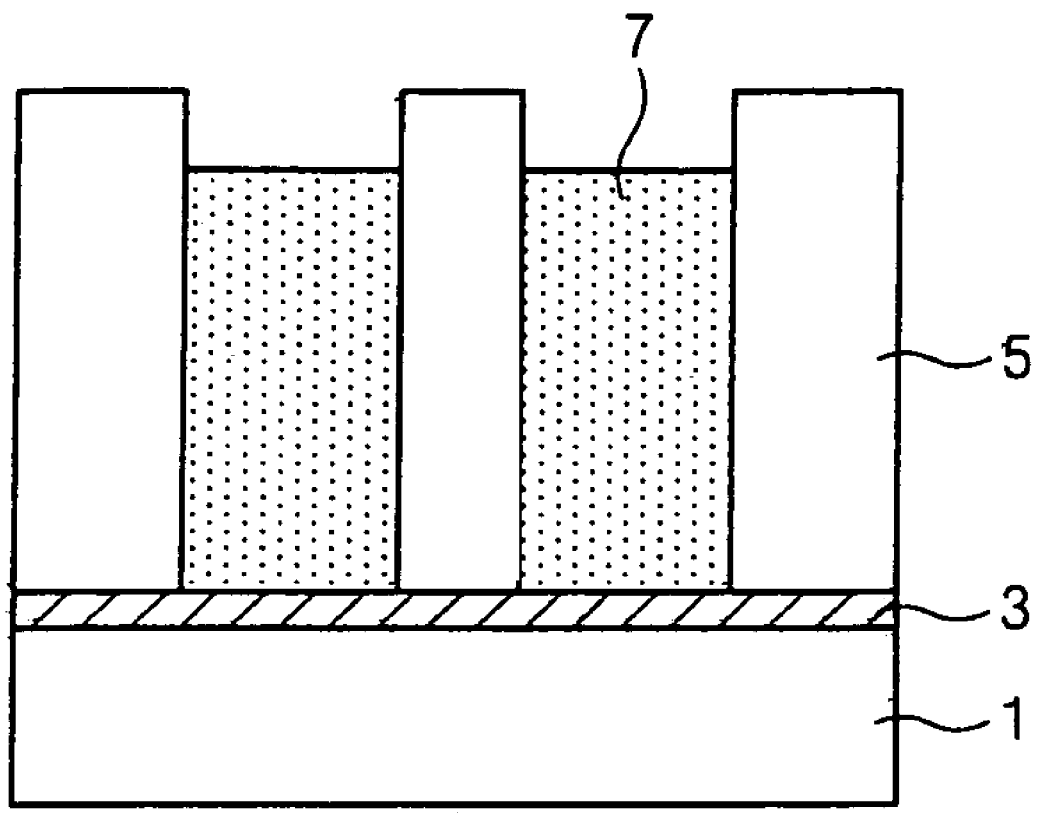
FIG. 1 is a cross-sectional view illustrating a Pt electrode formed using a disclosed solution.

CMP solutions containing an oxidizer in an alkali aqueous solution are disclosed. The CMP solutions can be used for polishing and planarizing Pt.

The alkali aqueous solution contains alkali compounds selected from the group consisting of sodium hydroxide, potassium hydroxide, tetramethyl ammonium hydroxide, tetraalkyl ammonium hydroxide and mixtures thereof. Potassium hydroxide (KOH) is preferably used. Here, the alkali aqueous solution preferably has a concentration ranging from 0.01 M to 10 M, and preferably ranging from 0.1 M to 5 M.

Examples of the oxidizer are any of the compounds which make Pt atoms lose the electrons to oxidize the Pt. For example, $Fe(NO_3)_2$ is used, and preferably $H_2O_2$ as the oxidizer. The oxidizer is present in concentration ranging from 1 vol % to 50 vol % to the alkali aqueous solution, and more preferably, ranging from 1 vol % to 10 vol % to the alkali aqueous solution.

It is preferable that the CMP solution comprising the alkali aqueous solution and the oxidizer maintains its pH ranging from 8 to 14, and more preferably ranging from 10 to 14.

In order to find out chemical reactivity of the Pt-CMP solution, after a predetermined voltage is externally applied to 1 M KOH aqueous solution containing 2 vol % $H_2O_2$ and other 1 M KOH aqueous solution not containing the oxidizer, current obtained by electro-chemical reactions generated on the Pt surface are measured.

As a result, it is shown that current density of KOH aqueous solution containing the oxidizer is higher than KOH solution not containing the oxidizer when having the same applied potential. Accordingly, it is recognized that Pt layers are more rapidly oxidized by the disclosed Pt-CMP solutions (see FIG. 2).

When an oxidation speed of the Pt surface exposed to air is compared with that of the Pt surface exposed to (1) a common slurry for metal, (2) KOH aqueous solution not containing the oxidizer and (3) the disclosed Pt-CMP solution containing oxidizer, the Pt surface exposed to the disclosed solution showed the highest concentration of oxygen. As a result, the Pt surface exposed to the disclosed CMP solution has a greater degree of oxidation after the polishing process (see FIGS. 3a through 3d).

The disclosed Pt-CMP solution changes the physical and chemical properties of the surface of Pt layer by way of the alkali aqueous solution and the oxidizer. That is, using the disclosed CMP solution, the binding strength and compactness between Pt atoms are decreased. Consequently, the oxidation speed of the Pt layer surface increases.

In this way, when the Pt surface is oxidized, its hardness is lowered such that the Pt surface is more easily polished. Thus, the polishing speed under the same pressure is faster and the polishing process is easier when the CMP process is performed on the Pt layer using the disclosed solution than when using a common slurry for metal.

In addition, in comparison with a conventional slurry, the disclosed Pt-CMP solution includes no abrasive and thus decreases scratches generated on the exposed interlayer insulating film.

A disclosed method for forming a platinum pattern comprises:

(a) forming an interlayer insulating film pattern having a contact hole on a semiconductor substrate;

(b) forming a platinum layer on the interlayer insulating film pattern; and (c) performing a primary platinum CMP process on an overall surface of the platinum layer with the interlayer insulating film pattern as an etching barrier film using the disclosed Pt-CMP solution.

Step (c) may further comprise performing a primary CMP process polishing the Pt layer using the disclosed CMP solution until interlayer insulating film is exposed and performing a secondary CMP process polishing the exposed interlayer insulating film using slurry for an interlayer insulating film.

In the primary CMP process, the Pt-formed semiconductor substrate is contacted with a polishing pad of a rotary table of a CMP system under pressure. Then, the disclosed Pt-CMP solution is supplied to an interface between the polishing pad and the Pt layer, and the Pt layer is polished.

Here, the CMP process is performed under a pressure ranging from 1 to 3 psi, at a table revolution of a rotary type system ranging from 10 to 80 rpm, and at a linear table speed ranging from 100 to 600 fpm depending upon the polishing speed of the Pt layer and the polishing property of the interlayer insulating film.

Thereafter, in the secondary CMP process, a touch polishing process of interlayer insulating film pattern is performed at the time the interlayer insulating film is exposed, using CMP slurry for interlayer insulating film. The touch polishing process is a buffering step to prevent the Pt layer from dishing generated by the difference in polishing selectivity between the Pt layer and the interlayer insulating film of the primary CMP process. Here, the polishing conditions are similar to that of the primary CMP process.

Various types of polishing pads can be used in the above CMP process according to the polishing properties of the Pt layer. For example, a soft pad can be used to raise uniformity of the polished layer and a hard pad can be used to improve planarity. And a stack pad laminated with the above two pads or the combination of the above pads can be also used.

In addition, a metal adhesion layer such as titanium (Ti) or titanium nitride (TiN) can be further formed on the top surface of the interlayer insulating film pattern before forming Pt layer so as to improve adhesiveness of the Pt layer.

That is, a disclosed method for forming a platinum pattern comprises:

(a) forming an interlayer insulating film pattern having a contact hole on a semiconductor substrate;

(b) forming a metal adhesion layer on the interlayer insulating film pattern;

(c) forming a platinum layer on the metal adhesion layer;

(d) performing a primary platinum CMP process on an overall surface of the platinum layer using the disclosed Pt-CMP solution until the metal adhesion layer is exposed;

(e) performing a secondary a CMP process on the resultant surface using a metal slurry until the interlayer insulating film is exposed; and (f) performing a touch-polishing process on the resultant surface using slurry for an interlayer insulating film.

Preferably, the interlayer insulating pattern is an oxide pattern, and the Pt pattern is used as the lower electrode pattern.

In the primary CMP process, the Pt-formed semiconductor substrate is contacted to a polishing pad of a rotary table of a CMP system under pressure. Then, the disclosed Pt-CMP solution is supplied to an interface of the polishing pad and the Pt layer, and the Pt layer is polished.

Here, as described above, the primary CMP process is performed under a pressure ranging from 1 to 3 psi, at a table revolution of a rotary type system ranging from 10 to 80 rpm, and at a linear table speed ranging from 100 to 600 fpm depending upon the polishing speed of the Pt layer and the polishing property of the interlayer insulating film.

Thereafter, in the secondary CMP process, the exposed metal adhesion layer is polished using metal CMP slurry until the interlayer insulating film is exposed.

In the tertiary CMP process, a touch polishing process of interlayer insulating film is performed at the time the interlayer insulating film is exposed, using CMP slurry for interlayer insulating film. The touch polishing process is a buffering step to prevent the Pt layer from dishing generated by the difference in polishing selectivity between the metal layer and the interlayer insulating film. Here, conditions of the secondary CMP process and the tertiary CMP process are similar to that of the primary CMP process.

The above secondary and tertiary CMP slurry for a metal and interlayer insulating film is used the general slurry.

The disclosed Pt-electrode pattern is shown in FIG. 1.

Referring to FIG. 1, a metal adhesion layer 3 is formed on a semiconductor substrate 1, and an interlayer insulating film (not shown) is sequentially formed thereon.

A general lithography is performed on a predetermined portion of the interlayer insulating film where the lower electrode is formed. Then, an opening portion to expose the metal adhesion layer 3 and an interlayer insulating film pattern 5 are formed.

After a Pt layer (not shown) is electro-deposited on the resultant surface, a CMP process is performed to form a Pt pattern 7 as a lower electrode.

In the above CMP process comprising the Pt-formed semiconductor substrate is contacted to a polishing pad formed on a rotary table of a CMP system under pressure. Then, the disclosed Pt-CMP solution containing $H_2O_2$ present at 1 to 10 vol % in a 0.1 to 5 M KOH aqueous solution is supplied to an interface of the polishing pad and the Pt layer, and the Pt layer is polished. Here, the primary CMP process is performed under a pressure ranging from 1 to 3 psi, at a table revolution of a rotary type system ranging from 10 to 80 rpm, and at a linear table speed ranging from 100 to 600 fpm. Thereafter, in the secondary CMP process, a touch polishing process is performed at the time the interlayer insulating film is exposed, using slurry for interlayer insulating film.

A soft pad, a hard pad, a stack pad laminated with the above two pads or the combination of the above pads can be used for the polishing pads used in the primary and the secondary CMP processes.

EXAMPLE 1

Preparation of the Disclosed Pt-CMP Solution

KOH (1 mole) was added to 1000 mL of ultra pure water to prepare 1 M KOH aqueous solution. The resulting solution was stirred, and $H_2O_2$ was added to be present in a final concentration of 2 vol % to the resulting solution. The resulting solution was further stirred for more than 10 minutes until it was completely mixed and stabilized, thereby obtaining the Pt-CMP solution.

EXPERIMENTAL EXAMPLE 1

Chemical Reactivity of the Disclosed Pt-CMP Solution

Figure 2:
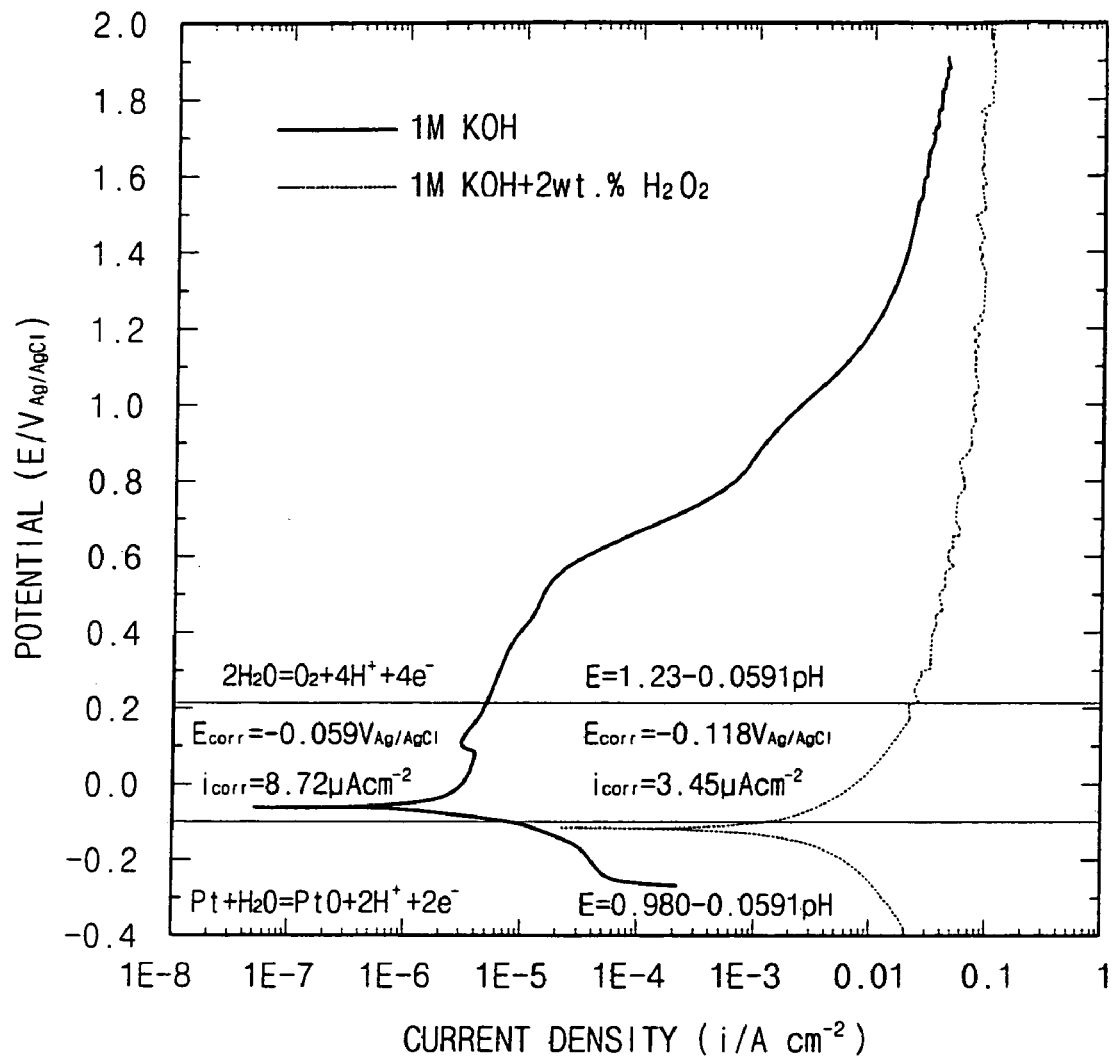
FIG. 2 is a graph illustrating a current dependent on a potential of Pt formed using a disclosed solution.

A Pt layer was dipped in 1 M KOH aqueous solution containing 2 vol % $H_2O_2$ prepared in the above Example 1 and other 1 M KOH aqueous solution not containing the oxidizer. Then, a voltage was applied to the two solutions, and a current generated on the surface of the Pt layer was compared. FIG. 2 shows the current dependent on a potential of the Pt layer formed using a disclosed solution.

When a potential was 0.4 $E/V_{Ag/Agcl}$, 1 M KOH aqueous solution not containing the oxidizer had a current density of $1\times10^{-5}$ $Am^{-2}$ while 1M KHO solution containing 2 vol % $H_2O_2$ had a high current density of about 0.05 $Am^{-2}$. That is, the Pt surface polished with the disclosed solution was more oxidized than the Pt surface polished with the solution not containing the oxidizer.

EXPERIMENTAL EXAMPLE 2

Oxidation of the Pt Surface Under Various Conditions

Figure 3A:
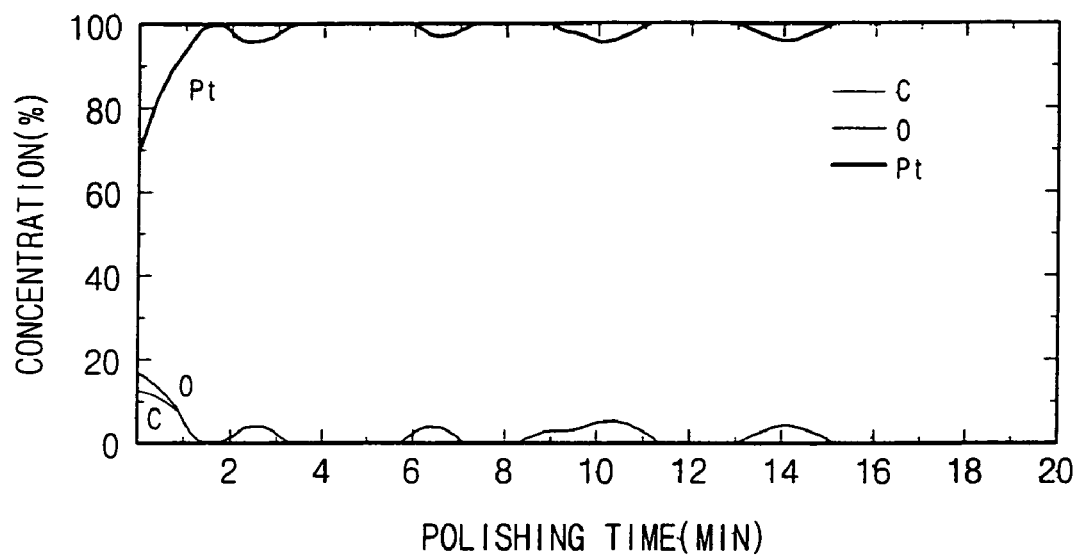
FIGS. 3a through 3d are graphs illustrating growth rate of Pt oxide layer under various solutions.
Figure 3B:
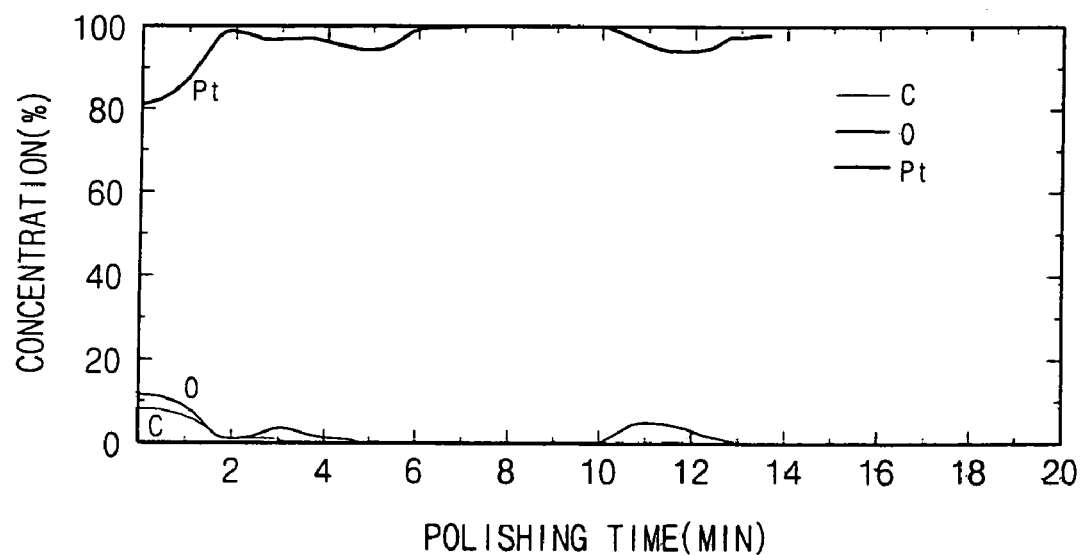
Figure 3C:
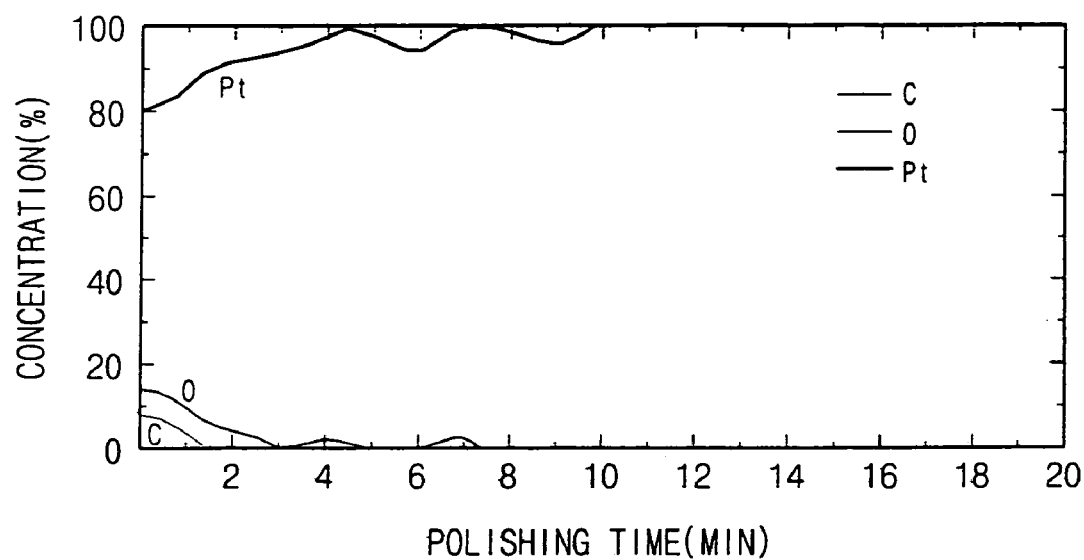

Platinum was dipped and oxidized respectively in (1) a common slurry for metal of pH 6 using $CeO_2$ as an abrasive (see FIG. 3a), (2) 1 M KOH aqueous solution not containing the oxidizer (see FIG. 3b) and (3) 1 M KHO solution containing 2 vol % $H_2O_2$ (see FIG. 3c). Then, the surface of Pt was polished at room temperature using AES (Auger Electron-Spectroscopy) at a speed of 50 Å/min, thereby measuring the time the oxidized portion was polished.

Figure 3D:
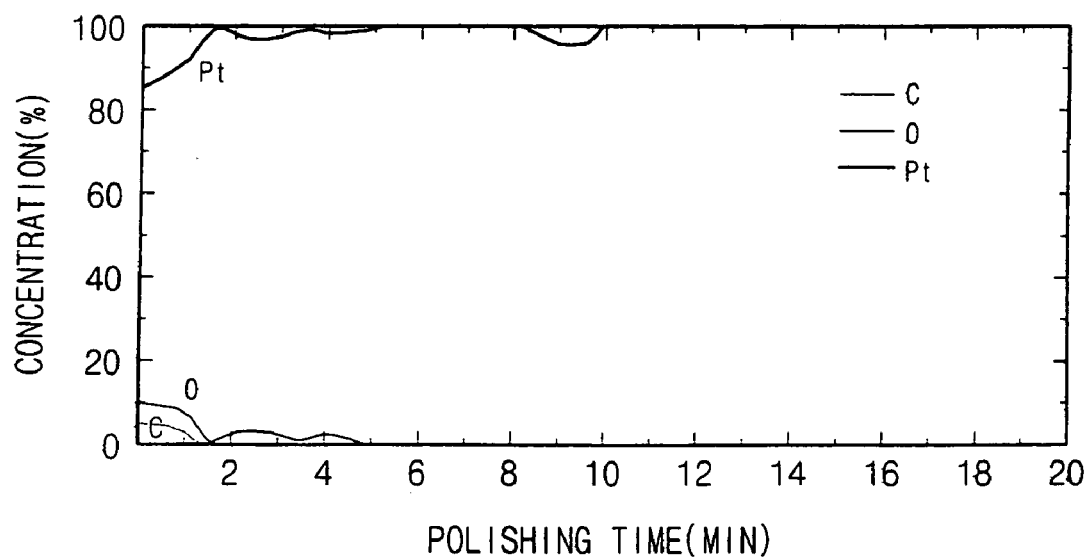

After the Pt layer was exposed to air and oxidized, the surface of Pt was polished at the same speed as described above, thereby measuring the time the oxidized portion was polished (see FIG. 3d).

FIGS. 3a through 3d show concentrations of elements such as Pt, O and C to polishing time. At an initial stage of the polishing process, the concentration of the oxide layer formed on the Pt surface is higher than that of the Pt. However, as the polishing process proceeded, it is shown that the concentration of the oxide layer decreases, and the concentration of the polished Pt increases.

The thickness (Å) where the oxide layer penetrates into the Pt surface in various kinds of slurries is obtained by measuring polishing time until the oxide layer is removed by the polishing process. In other words, the slurry for oxidizing most the Pt surface was known by the polishing time. Table 1 shows the results as follows.

TABLE 1

| Pt dipping condition | Thickness of oxide layer penetrating into Pt surface (Å) |
|---|---|
| Common slurry for metal | 100 |
| KOH aqueous solution | 75 |
| Disclosed KOH aqueous solution containing oxidizer | 225 |
| Exposure to air | 75 |

As shown in Table 1, the surface of Pt dipped in the alkali aqueous solution containing the disclosed oxidizer is oxidized the most. Therefore, the polishing speed of the Pt layer is increased due to the oxide layer, thereby improving the polishing speed and effect.

As discussed earlier, the disclosed CMP process is performed by using the disclosed platinum CMP solution containing the oxidizer in the alkali aqueous solution, which improves the polishing speed of platinum under a low pressure and reduces dishing of the Pt layer. In addition, the disclosed solution decreases scratches generated in the interlayer insulating film because the solution does not contain an abrasive like conventional slurries for metal. As a result, an improved technique for device isolation and reduction of step coverage is disclosed.

What is claimed is:

1. A method for forming a platinum pattern comprising:
   forming an interlayer insulating pattern having a contact hole on a semiconductor substrate;
   forming a metal adhesion layer on the interlayer insulating pattern;
   forming a platinum layer on the metal adhesion layer; and
   performing a first platinum-chemical mechanical polishing (CMP) process on the platinum layer using a platinum-CMP solution until the metal adhesion layer is exposed, thereby forming a platinum pattern as a lower electrode, the platinum-CMP solution being substantially free of abrasive and comprising an alkali aqueous solution and an oxidizer;
   performing a second CMP process on the exposed metal adhesion layer using a metal slurry until the interlayer insulating pattern is exposed; and,
   performing a touch-polishing process on the exposed interlayer insulating pattern using an interlayer insulating pattern slurry.

2. The method according to claim 1, wherein the interlayer insulating pattern is an oxide pattern.

3. The method according to claim 1, wherein the metal adhesion layer is titanium (Ti) or titanium nitride (TiN).

4. The method according to claim 1, wherein the alkali aqueous solution of the platinum-CMP solution comprises an alkali compound selected from the group consisting of sodium hydroxide, potassium hydroxide, tetramethyl ammonium hydroxide, tetraalkyl ammonium hydroxide and mixtures thereof.

5. The method according to claim 1, wherein the oxidizer of the platinum-CMP solution is selected from the group consisting of $H_2O_2$, $Fe(NO_3)_2$ and mixtures thereof.

6. The method according to claim 1, wherein the concentration of the alkali aqueous solution of the platinum-CMP solution ranges from 0.01 M to 10 M.

7. The method according to claim 6, wherein the concentration of the alkali aqueous solution of the platinum-CMP solution ranges from 0.1 M to 5 M.

8. The method according to claim 1, wherein the oxidizer of the platinum-CMP solution is present in a concentration ranging from 1 vol % to 50 vol % of the alkali aqueous solution.

9. The method according to claim 8, wherein the oxidizer of the platinum-CMP solution is present in a concentration ranging from 1 vol % to 10 vol % of the alkali aqueous solution.

10. The method according to claim 1, wherein the pH of the platinum-CMP solution ranges from 8 to 14.

11. The method according to claim 10, wherein the pH of the platinum-CMP solution ranges from 10 to 14.

12. A method for forming a platinum pattern comprising:
   forming an interlayer insulating pattern having a contact hole on a semiconductor substrate;

forming a metal adhesion layer on the interlayer insulating pattern;

forming a platinum layer on the metal adhesion layer;

performing a first platinum-CMP process on an overall surface of the platinum layer using a platinum-CMP solution comprising a KOH aqueous solution and hydrogen peroxide until the metal adhesion layer is exposed to form a platinum pattern as a lower electrode;

performing a second CMP process on the resultant surface using a metal slurry until the interlayer insulating pattern is exposed; and performing a touch-polishing process on the resultant surface using an interlayer insulating pattern slurry.

13. The method according to claim 12, wherein the platinum-CMP solution is substantially free of abrasive.

14. The method according to claim 12, wherein the concentration of the KOH aqueous solution ranges from 0.01 M to 10 M, and hydrogen peroxide is present in a concentration ranging from 1 vol % to 50 vol % of the KOH aqueous solution.

* * * * *